United States Patent
Duan et al.

(10) Patent No.: US 11,341,048 B2
(45) Date of Patent: May 24, 2022

(54) SLC CACHE ALLOCATION

(71) Applicant: Micron Technology, Inc., Boise, ID (US)

(72) Inventors: Xinghui Duan, Shanghai (CN); Guanzhong Wang, Shanghai (CN); Xu Zhang, Shanghai (CN); Eric Kwok Fung Yuen, Dublin, CA (US)

(73) Assignee: Micron Technology, Inc., Boise, ID (US)

( * ) Notice: Subject to any disclaimer, the term of this patent is extended or adjusted under 35 U.S.C. 154(b) by 318 days.

(21) Appl. No.: 16/488,718

(22) PCT Filed: Oct. 29, 2018

(86) PCT No.: PCT/CN2018/112452
§ 371 (c)(1),
(2) Date: Aug. 26, 2019

(87) PCT Pub. No.: WO2020/087211
PCT Pub. Date: May 7, 2020

(65) Prior Publication Data
US 2021/0334211 A1 Oct. 28, 2021

(51) Int. Cl.
*G11C 11/56* (2006.01)
*G06F 12/06* (2006.01)
(Continued)

(52) U.S. Cl.
CPC ...... *G06F 12/0646* (2013.01); *G06F 12/0893* (2013.01); *G11C 11/5628* (2013.01);
(Continued)

(58) Field of Classification Search
CPC ............ G06F 12/0646; G06F 12/0893; G06F 2212/601; G11C 16/0483; G11C 11/5671; G11C 16/10; G11C 11/5628; G11C 16/26
(Continued)

(56) References Cited

U.S. PATENT DOCUMENTS 8,886,911 B2  11/2014 Nemazie et al.
9,478,290 B1* 10/2016 Nam ................. G11C 16/3427
(Continued)

FOREIGN PATENT DOCUMENTS

CN    102591807 A    7/2012
CN    103688246 A    3/2014
(Continued)

OTHER PUBLICATIONS

"International Application Serial No. PCT CN2018 112452, International Preliminary Report on Patentability dated May 14, 2021", 5 pgs.

(Continued)

*Primary Examiner* — Michael T Tran

(74) *Attorney, Agent, or Firm* — Schwegman Lundberg & Woessner, P.A.

(57) ABSTRACT

Disclosed in some examples are memory devices which feature intelligent adjustments to SLC cache configurations that balances memory cell lifetime with performance. The size of the SLC cache can be adjusted during usage of the memory device based upon a write amplification (WA) metric of the memory device. In some examples, the size of the SLC cache can be adjusted during usage of the memory device based upon a write amplification (WA) metric of the memory device and a memory device logical saturation metric (percentage of valid user data written in the device of the total user size).

20 Claims, 9 Drawing Sheets

(51) Int. Cl.
*G06F 12/0893* (2016.01)
*G11C 16/04* (2006.01)
*G11C 16/10* (2006.01)
*G11C 16/26* (2006.01)

(52) U.S. Cl.
CPC ...... *G11C 11/5671* (2013.01); *G11C 16/0483* (2013.01); *G11C 16/10* (2013.01); *G06F 2212/601* (2013.01); *G11C 16/26* (2013.01)

(58) Field of Classification Search
USPC .................................................. 711/125, 129
See application file for complete search history.

(56) References Cited

U.S. PATENT DOCUMENTS

| | | | |
|---|---|---|---|
| 9,606,737 | B2 | 3/2017 | Kankani et al. |
| 10,339,983 | B1* | 7/2019 | Confalonieri ........ G11C 16/349 |
| 2008/0158993 | A1* | 7/2008 | Jung .................. G11C 16/3454 |
| | | | 365/185.22 |
| 2010/0122016 | A1 | 5/2010 | Marotta et al. |
| 2012/0224425 | A1 | 9/2012 | Fai et al. |
| 2012/0311293 | A1 | 12/2012 | Nemazie et al. |
| 2014/0059406 | A1 | 2/2014 | Hyun et al. |
| 2014/0101372 | A1 | 4/2014 | Jung et al. |
| 2016/0098350 | A1 | 4/2016 | Tang et al. |
| 2016/0293271 | A1* | 10/2016 | Won .................. G11C 29/12005 |
| 2016/0314844 | A1* | 10/2016 | Dutta .................. G11C 11/5628 |
| 2016/0343444 | A1* | 11/2016 | Park ........................ G11C 16/10 |
| 2018/0285258 | A1* | 10/2018 | Muchherla .............. G06F 3/061 |
| 2019/0138442 | A1* | 5/2019 | Thiruvengadam ........................... |
| | | | G06F 13/1694 |
| 2019/0156893 | A1* | 5/2019 | Lee .......................... G11C 8/12 |
| 2019/0198109 | A1* | 6/2019 | Li ..................... H01L 27/11524 |

FOREIGN PATENT DOCUMENTS

| | | |
|---|---|---|
| WO | 2020087211 | 5/2020 |
| WO | 2020087211 | 7/2020 |

OTHER PUBLICATIONS

"International Application Serial No. PCT/CN2018/112452, International Search Report dated Jun. 11, 2019", 4 pgs.
"International Application Serial No. PCT/CN2018/112452, Written Opinion dated Jun. 11, 2019", 4 pgs.
Gasior, Geoff, "Micron's M600 SSD acceletrates writes with dynamic SLC cache", Micron—The Tech Report, [Online]. Retrieved from the Internet: <URL: techreport.com/news/27056/micron-m600-ssd-accelerates-writes-with-dynamic-slc-cache>, (Jul. 26, 2017), 3 pgs.
Glen, Dave, "Optimized Client Computing With Dynamic Write Acceleration", Micron, (2014), 5 pgs.
Lee, Sungjin, et al., "FlexFS: A Flexible Flash File System for MLC NAND Flash Memory", Seoul National University, Korea Samsung Electronics, Korea, (Jun. 2009), 14 pgs.
Oh, Yongseok, "Caching less for better performance: Balancing cache size and update cost of flash memory cache in hybrid storage systems", https://www.usenix.org/legacy/events/fast12/tech/full_papers/Oh.pdf.

* cited by examiner

SLC CACHE ALLOCATION

PRIORITY APPLICATION

This application is a U.S. National Stage Application under 35 U.S.C. 371 from International Application No. PCT/CN2018/112452, filed Oct. 29, 2018, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

As will be explained more fully below, a pool of memory cells of the memory device are allocated as a high-speed cache and a second pool of memory cells of the memory device are allocated as storage. Writes are first written to SLC cache to take advantage of the fast write performance of the SLC cells and then later written to MLC storage such to take advantage of the greater storage capacities of MLC memory. The size of the first and second pools of memory cells can be adjusted as cells can be reconfigured between SLC and MLC cells.

Disclosed in some examples are memory devices which feature intelligent adjustments to SLC cache configurations that balances memory cell lifetime with performance. The size of the SLC cache can be adjusted during usage of the memory device based upon a write amplification (WA) metric of the memory device. In some examples, the size of the SLC cache can be adjusted during usage of the memory device based upon a write amplification (WA) metric of the memory device and a memory device logical saturation metric (percentage of valid user data written in the device of the total user-available data space).

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (WM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

Figure 1:
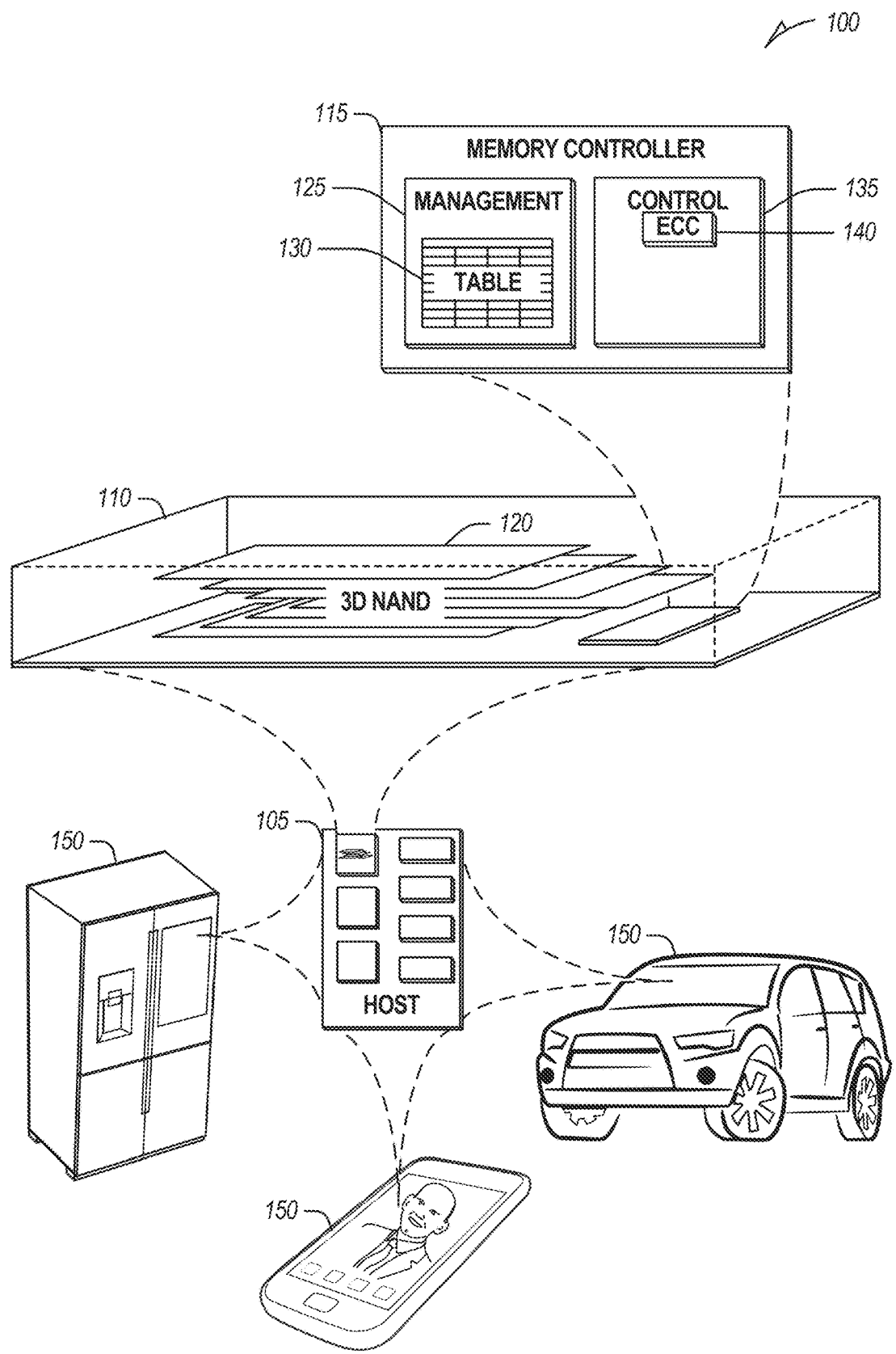
FIG. 1 illustrates an example of an environment including a memory device.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die, one or more NAND dies, or the like). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 1000 of FIG. 10.

The memory controller 115 can be on one or more separate integrated circuits from the memory array 120 or can be on a same integrated circuit. In some examples, the functions of memory controller 115 can be divided across multiple integrated circuits. For example, some functionality can be on a separate integrated circuit and some functionality can be part of a controller on each memory die of the memory array 120. Memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array can comprise a number of NAND dies and one or more functions of the memory controller 115 for a particular NAND die can be implemented on an on-die controller on that particular die. Other organizations and delineations of control functionality can also be utilized, such as a controller for each die, plane, superblock, block, page, and the like.

The memory array 120 can include several memory cells arranged in, for example, a number of devices, semiconductor dies, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
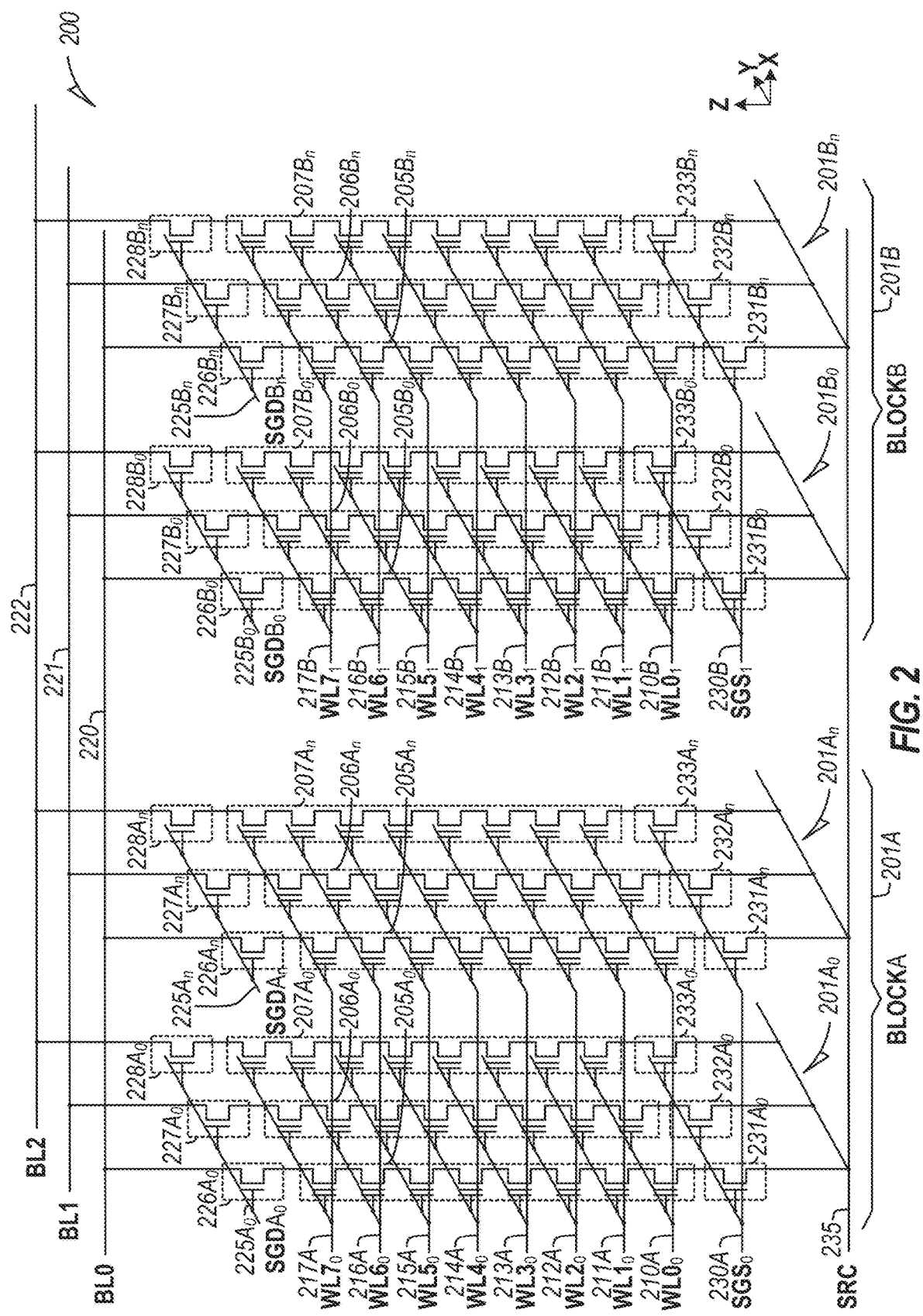
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201A$_0$, sub-block $A_n$ 201A$_n$, sub-block $B_0$ 201B$_0$, sub-block $B_n$ 201B$_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ 225A$_0$, first-third $A_n$ SGD $226A_n$-$228A_n$ can be accessed using an $A_n$ SGD line $SGDA_n$ 225A$_n$, first-third $B_0$ SGD $226B_0$-$228B_0$ can be accessed using an $B_0$ SGD line $SGDB_0$ 225B$_0$, and first-third $B_n$ SGD $226B_n$-$228B_n$ can be accessed using an $B_n$ SGD line $SGDB_n$ 225B$_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
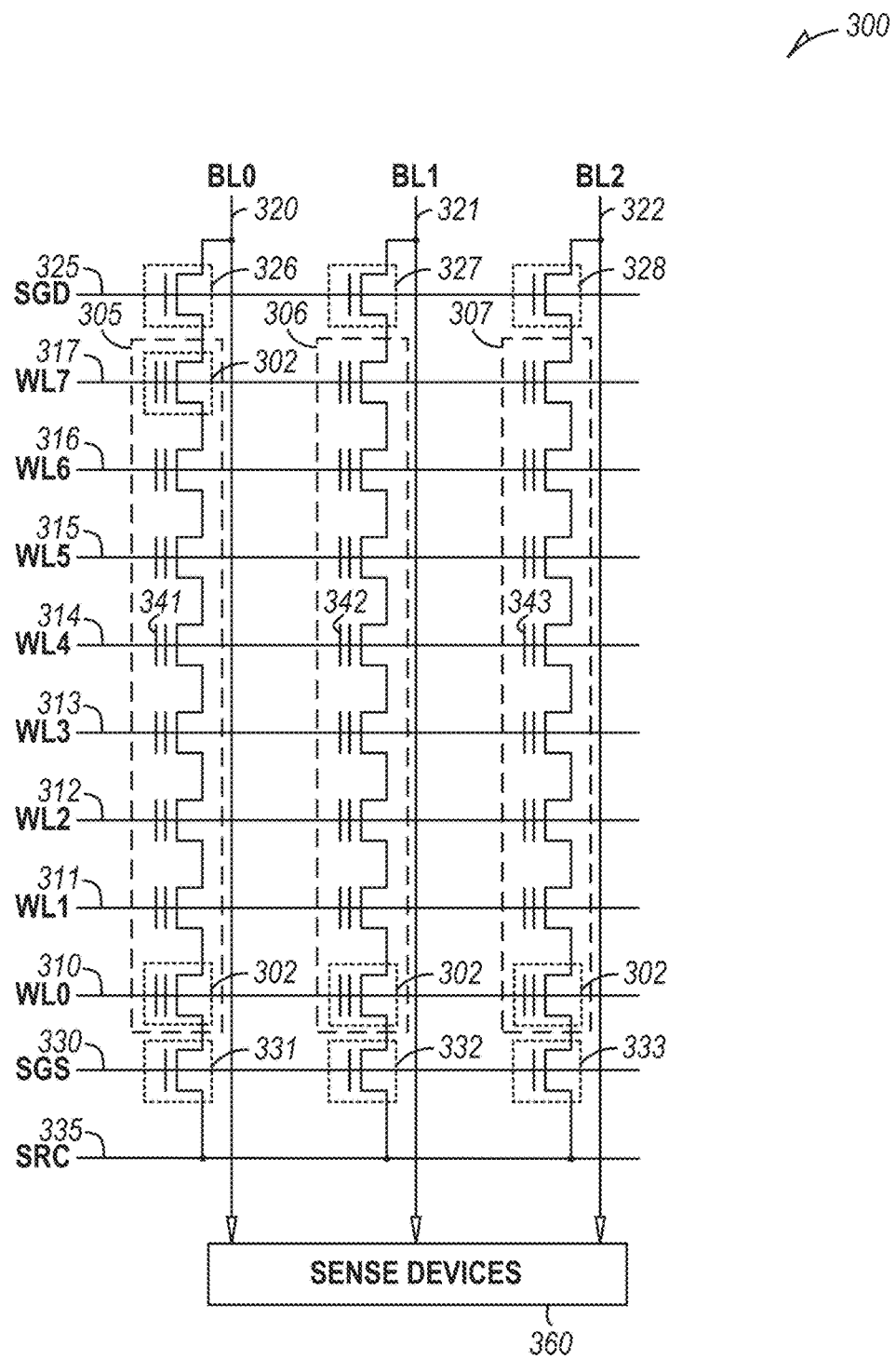

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pukes, etc.) can be applied to selected word lines (e.g., WL4), and thus, to a control gate of each memory cell coupled to the selected word lines (e.g., first-third control gates (CGs) 341-343 of the memory cells coupled to WL4). Programming pukes can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

hi contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. in other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pukes can be applied. If the selected memory cell has not reached its intended programmed state after a particular number of programming pukes (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
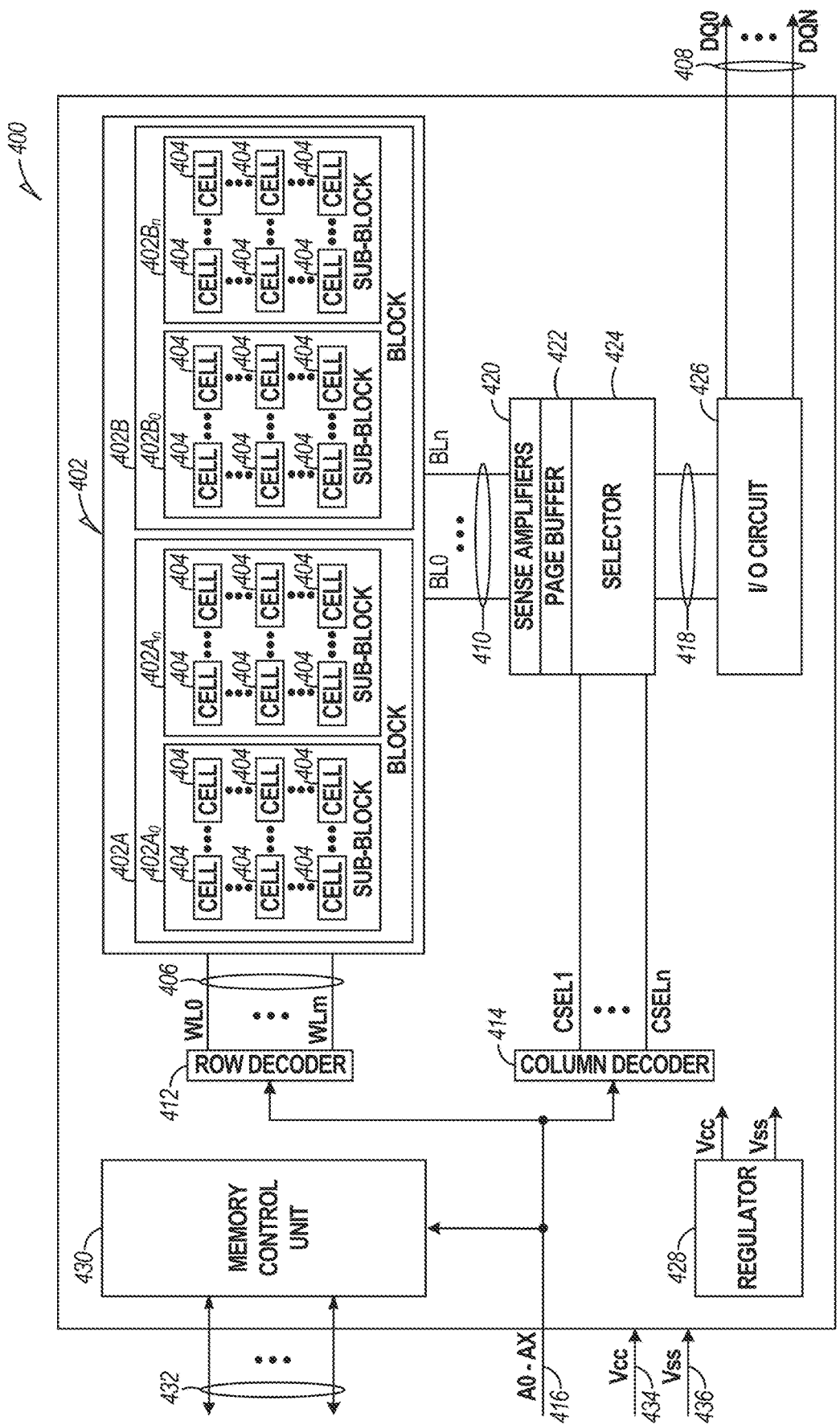
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402E can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more dock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418. In some examples a flash translation layer (not shown) can map addresses provided by a host to physical memory addresses used by the row decoder 412 and column decoder 414 to read data in the memory array 402.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

As previously described, memory cells of a memory device can be arranged as either storing a single bit of data (SLC), or multiple bits of data (MLC). SLC memory cells typically offer the best performance and are more reliable. For example, SLC cells are written to with fewer programming cycles which reduces the chances of corruption from an unexpected power loss during programming. SLC cells however store less data and manufacturing memory devices in capacities suitable for use as a storage device using just SLC memory cells is less cost effective. A compromise solution that has been developed is to configure some cells as SLC and the rest of the cells as MLC. Data is first written to the SLC and then later transferred to the MLC when the memory device is not busy. In some examples, when receiving a host write request, the memory controller can first check to see if there is free SLC cache. If there is free SLC cache, the memory controller can write the data to the SLC cache. If there is no free SLC cache, the memory controller can directly write the data to MLC storage. The use of SLC cells in this way can be termed an SLC cache. This SLC cache mechanism provides a balance between the speed and reliability of SLC memory cells with the storage capacity of MLC memory cells.

In some example memory devices, the size of the SLC cache is fixed at device manufacturing time (fixed-size SLC cache). In other examples, since memory cells can be reconfigurable by firmware between SLC and MLC, the cache size can vary during usage (dynamic size SLC cache). In memory devices featuring dynamic size SLC caches, the cache size is typically varied based upon how full the memory device is (device utilization). As the device fills up, memory cells configured as SLC cache are migrated to MLC to increase total data storage capacity.

One downside to the use of SLC cache is that it increases the amount of times data is written to the physical memory because data is written twice—once to the SLC cache, and then later to MLC storage. Instances in which same data is written multiple times to flash will increase Write Amplification (WA). WA can be defined as the actual amount of information physically written to the storage media divided by the data amount written by the host. The memory device can track the data amount written to the flash and data amount written from the host. In addition to the use of SLC cache, an amount of WA is also affected by other necessary tasks on the NAND such as garbage collection. The larger the SLC cache, the more likely a write request is to be serviced by SLC cache. Consequentially, the larger the SLC cache the greater the likelihood of an increase in write amplification.

Disclosed in some examples are methods, systems, memory devices, and machine-readable mediums which set a size of a dynamic SLC cache based in whole or in part upon a write amplification metric. In some examples a write amplification metric can be calculated and used in determining an SLC cache size. The memory cells can then be reconfigured so that the SLC cache is the newly determined size. For example, MLC cells can be configured to be SLC cells to increase a size of the SLC cache and SLC cells can be reconfigured to be MLC cells to decrease the size of the cache. In some examples, to reconfigure the cache (e.g., to decrease the SLC cache size), data in the SLC cache can be moved to MLC storage. In some examples, in addition to write amplification, the memory device can also consider a logical saturation of the memory device.

As an example, the memory device may operate at some periods of time with a first SLC cache size, and during different periods of time may change to operating at a second SLC cache size that is different (either more or less) than the first SLC cache size. The SLC cache size at a particular time may be calculated based upon one or more of WA and logical saturation. Thus, at a first time the cache may be larger than a second time in response to a write amplification being smaller at the first time than the second time. Similarly, at a first time the cache may be smaller than the second time in response to a write amplification being larger at the first time than the second time.

By factoring in write amplification as part of a determination of an SLC cache size, the memory device can be better customized to the work load of the user to balance performance and device lifetime. This contrasts with previous methods of SLC cache size determination that did not consider WA. Considering write amplification when setting SLC cache size allows the memory device to increase the SLC cache to provide greater burst performance and a better user experience for light workload users as the lighter workload generally will mean a lower write amplification (as the user will have had less garbage collection and less usage of SLC cache). In this case, the amount of WA poses less risk of the device wearing out prior to an expected device life. In contrast, for heavy users, SLC cache can be reduced which reduces performance but increases life expectancy of the memory device. Even for these heavy users, their workloads are not always heavy during a lifetime of the device. When the WA is small, the system increases an SLC cache size and correspondingly allows more data written to SLC to improve the user experience. When the WA is large, SLC cache size can be reduced, thus causing more data to be written to MLC storage (which may be, for example (TLC or QLC) directly and reduce a total bytes written of the drive.

In some examples, the relationship between total-bytes-written (TBW) in terabytes and SLC cache size can be calculated. If x is the ratio of host data written to SLC cache (where 0<x<1), then TBW*x is the number of bytes written to SLC cache first. The program/erase (PE) cycles for these writes can be calculated as:

$$PE = TBW * x * \frac{2^{20}}{144}$$

Where 144 is the size of an SLC virtual block (2-die) in Megabytes and $2^{20}$ is the number of bytes in a megabyte.

For the number of bytes written to MLC (assume three bits per cell-TLC), the number of bytes is the difference of the total data written to the flash and the total data written to the SLC:

$$TBW * WA - TBW * x = TBW * (WA - x)$$

$$PE = TBW * (WA - x) * \frac{2^{20}}{432}$$

Where WA is defined as:

$$WA = \left(\frac{\text{data written to flash}}{\text{data written by host}}\right)$$

To obtain the total PE cycles, we add the two PE cycle calculations together and simplify:

$$\text{Total } PE = TBW * x * \frac{2^{20}}{144} + TBW * (WA - x) * \frac{2^{20}}{432} \leq$$

User $VBCount * TLC\ PE$ Cycles

Where in one example, user VB count=304 and TLC PE Cycles is 3000. After simplification we have:

$$TBW \leq \frac{375}{2x + WA}$$

The following table shows the TBW for various WA (column) and X (row):

|   | WA |     |     |     |    |     |    |     |    |     |    |
|---|----|-----|-----|-----|----|-----|----|-----|----|-----|----|
| x | 2  | 2.5 | 3   | 3.5 | 4  | 4.5 | 5  | 5.5 | 6  | 6.5 | 7  |
| 0   | 187 | 150 | 125 | 107 | 93 | 83 | 75 | 68 | 62 | 57 | 53 |
| 0.1 | 170 | 138 | 117 | 101 | 89 | 79 | 72 | 65 | 60 | 55 | 52 |
| 0.3 | 144 | 120 | 104 | 91  | 81 | 73 | 66 | 51 | 56 | 52 | 49 |
| 0.5 | 125 | 107 | 93  | 83  | 75 | 68 | 62 | 57 | 53 | 50 | 46 |
| 0.7 | 110 | 96  | 85  | 76  | 69 | 63 | 58 | 54 | 50 | 47 | 44 |
| 0.9 | 98  | 87  | 78  | 70  | 64 | 59 | 55 | 51 | 48 | 45 | 42 |
| 1   | 93  | 83  | 75  | 68  | 62 | 57 | 53 | 50 | 47 | 44 | 41 |

As can be appreciated the larger the WA, the smaller the total bytes written (TBW) before the memory wears out (assuming 3000 PE). The bigger the x the smaller the TBW. Thus, the more data written to the SLC cache, the smaller the TBW will be. For a given TBW, if WA is small it allows bigger x values—that is, more data written to the SLC cache and better burst performance.

One way of setting SLC cache size can be to use a linear function based upon the logical saturation (percentage of valid user data to total user size). Thus, at a particular logical saturation, the SLC cache size can be set to a particular value. One example linear function can be:

SLC Cache Size=−10*(logical Saturation)+11

Figure 5:
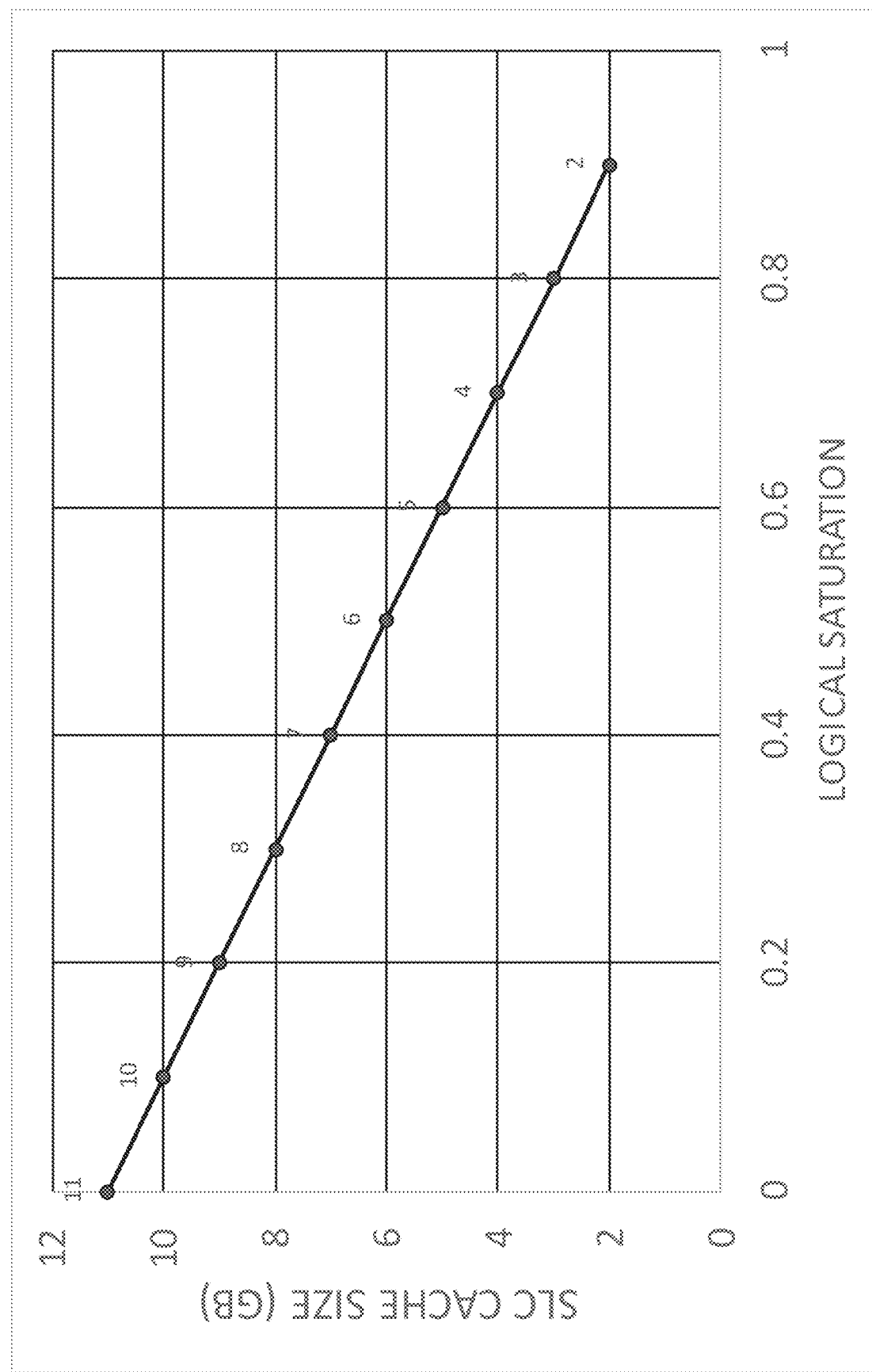
FIG. 5 illustrates a plot of cache size vs. logical saturation according to some examples of the present disclosure.

A graph of this function is shown in FIG. 5.

In some examples, the SLC cache size can be based on WA rather than logical saturation—e.g., SLC cache size can be a linear function dependent upon WA. In some examples of the present disclosure, WA can be considered along with the logical saturation. For example, for a given logical saturation the SLC cache size can be selected based upon a current WA. An example is shown for logical saturation of 50%:

| WA | 2 | 2.5 | 3 | 3.5 | 4 | 4.5 | 5 |
|---|---|---|---|---|---|---|---|
| SLC Cache Size (GB) | 6 | 5 | 4 | 3 | 2 | 1 | 0 |

In some examples, the range of logical saturation values can be divided into zones (e.g., 0-10%, 11-20%, and the range of write amplification values can be divided into zones (e.g., 0-2, 2.1-2,5, 2.6-3, 3.1-3.5, 3.6-4,41-4.5, 4.6-5). A cache size table can be created for each logical saturation value zone that lists an SLC cache size for each applicable write amplification zone. Thus, according to current WA and logical saturation, the memory controller can determine the optimal SLC cache size when opening a new block for writing. The controller can then reconfigure the memory cells so as to match the size of the SLC cache with the size shown in the table.

In one example, the SLC cache size setting can be set based upon a TBW target for the memory device. The TBW target is a target device lifetime. For example, if we substitute the TBW target for TBW in the above formula we have:

$$TBW \text{ target} \leq \frac{375}{2x + WA}$$

So, for example if the TBW target is 75 TB, we have:

$$75 \leq \frac{375}{2x + WA} \rightarrow 2x + WA \leq 5$$

In this example, when the memory controller firmware detects that the WA is close to 5, SLC cache size should be reduced to 0. An example table of SLC cache size based upon WA (column) and logical saturation (row) is shown below:

|           | 1.5 | 2 | 2.5 | 3 | 3.5 | 4 | 4.5 | 5 |
|-----------|-----|---|-----|---|-----|---|-----|---|
| 0(0-10%)   | 10 | 9 | 8 | 7 | 5 | 3 | 1 | 0 |
| 1(11%-20%) | 9  | 8 | 7 | 6 | 4 | 2 | 1 | 0 |
| 2(21%-30%) | 8  | 7 | 6 | 5 | 4 | 2 | 1 | 0 |
| 3(31%-40%) | 7  | 6 | 5 | 4 | 3 | 2 | 1 | 0 |
| 4(41%-50%) | 6  | 5 | 4 | 3 | 2 | 1 | 1 | 0 |
| 5(51%-60%) | 5  | 4 | 3 | 2 | 2 | 1 | 1 | 0 |
| 6(61%-70%) | 4  | 3 | 2 | 2 | 1 | 1 | 1 | 0 |
| 7(71%-80%) | 3  | 3 | 2 | 2 | 1 | 1 | 1 | 0 |
| 8(81%-90%) | 2  | 2 | 2 | 1 | 1 | 1 | 1 | 0 |
| 9(91%-100%)| 1  | 1 | 1 | 1 | 1 | 1 | 0 | 0 |

The above table may be calculated from the TBW target during operation of the memory controller, or may be preloaded into the memory device.

Figure 6:
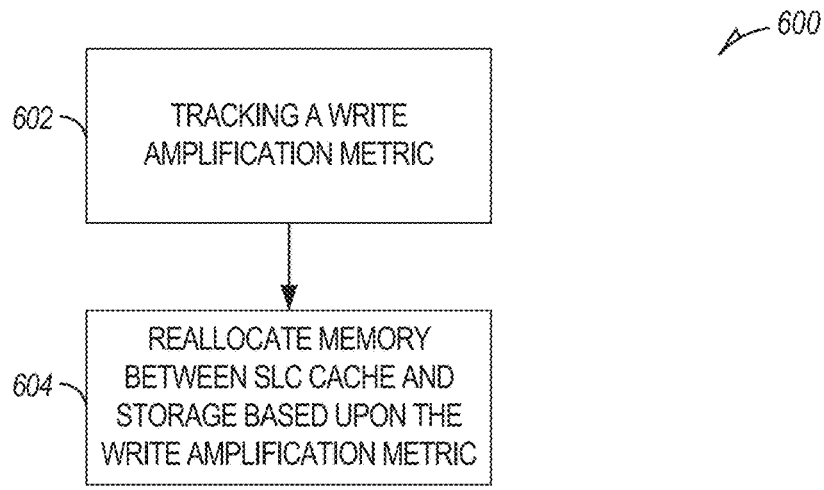
FIGS. 6 and 7 illustrate methods of adjusting an SLC cache size based upon a write amplification metric according to some examples of the present disclosure.

Turning now to FIG. 6, a flowchart of a method 600 of reallocating memory between SLC cache and MLC storage is shown according to some examples of the present disclosure. At operation 602 a write amplification metric can be tracked by the memory device (e.g., a memory controller). In some examples, the memory device can track one or more write amplification metric components—such as a total size of all data requested to be written by the host and a total size of all data written to flash. In some examples, the write amplification can then be calculated using these components. For example, a write amplification can be the total size of all data that already has been written to flash divided by the total size of all data requested to be written by the host. The write amplification metric used to determine the SLC cache size may be a write amplification metric snapshot e.g., the write amplification currently observed—rather than an expected or predicted write amplification given the data in the SLC cache. For example, if 10 GB is written to the memory device by the host, hut the total amount currently written to physical flash is 20 GB—a write amplification can be 2. For example, in addition to SLC cache, write amplification can also be the result of garbage collection and other processes on the memory device.

The write amplification metric components can be tracked continuously (e.g., updated for each memory operation in which WA can be impacted) or can be tracked every predetermined period of time. The WA can be updated when the write amplification metric components are updated or can be updated at different times. In some examples, the write amplification can be for an entire device lifetime. In other examples the write amplification can be for a period of time (e.g., a day, week, month, etc . . . ).

At operation 604 the memory device (e.g., a memory controller) can reallocate memory cells between SLC cache and MLC storage based upon the write amplification metric. For example, based upon a linear equation of the write amplification metric or a table listing the SLC cache size for a given write amplification or a table listing the SLC cache size for a given write amplification and a given logical saturation. In some examples, if a write amplification increases, an SLC cache size decreases and memory cells assigned to SLC cache can be reconfigured to be MLC (either 2, 3, 4, or more bits per cell) cells and allocated to a MLC storage pool. If a write amplification decreases, then memory cells assigned to MLC storage can be reconfigured to be SLC cells that are reallocated as part of the SLC cache. As previously noted, in addition to WA metrics, logical saturation can also factor into an SLC cache size.

In some examples, each time the WA is calculated at operation 602 the optimal SLC cache size can be determined and if the optimal SLC cache size differs from the indicated SLC cache size, the SLC cache can be reconfigured, or scheduled for a later reconfiguration (e.g., when there is free space in the SLC cache that can be reclaimed as MLC storage). In other examples, the SLC cache size can be checked and/or reconfigured at a frequency that is independent of when the WA is calculated or updated. The WA metric may be continuously updated or may be periodically updated. Likewise the SLC cache size may be continuously updated or may be periodically updated.

In some examples, whether to reconfigure the cache depends upon a WA and a logical saturation. In some examples, the controller tracks a logical saturation metric which tracks logical saturation as well (not shown for clarity in FIG. 6). Logical saturation can be defined as the portion of user logical block addresses (LBAs) that contain data. Whether the cache is reconfigured or not depends upon both the WA and logical saturation metrics and whether, for a given logical saturation and write amplification, the size of the cache indicated in a memory table matches a current size, or whether the table indicates a larger or smaller size is appropriate.

Figure 7:
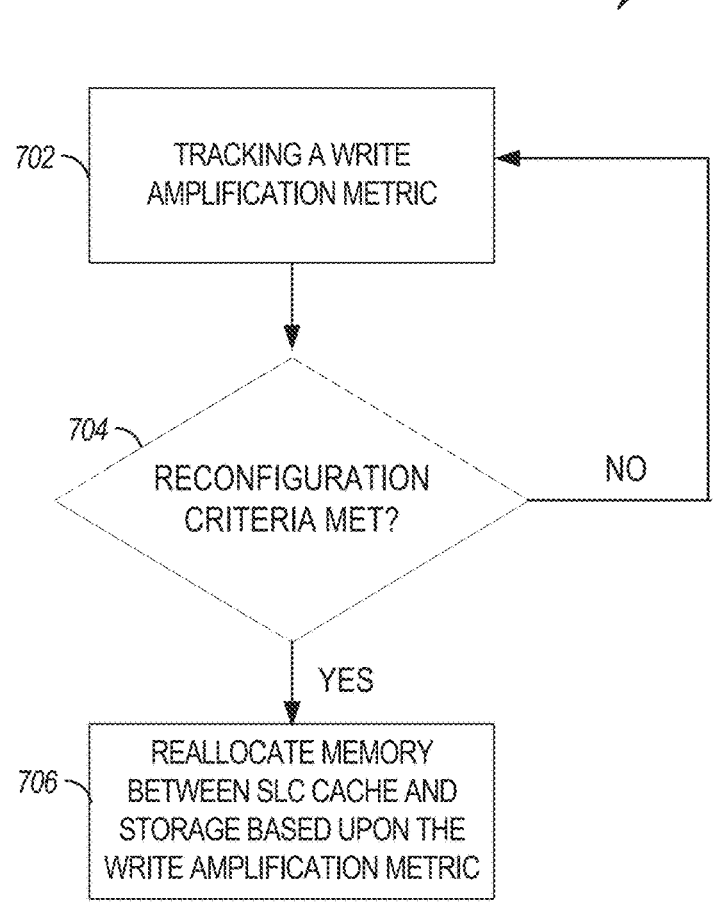

Turning now to FIG. 7, a flowchart of another method 700 of reallocating memory between SLC cache and MLC storage is shown according to some examples of the present disclosure. As in FIG. 6, the write amplification metric can be tracked. At operation 704, a determination can be made as to whether one or more reconfiguration criteria are met. For example, if the write amplification metric exceeds one or more of: a threshold, whether or not the current SLC cache size is different than a size indicated by a table based upon the current WA and logical saturation, expiration of a timer, or the like. If the reconfiguration criteria are met, then at operation 706 one or more memory cells can be reallocated between SLC cache and MLC storage based upon the write amplification metric and in some examples, based upon the logical saturation. If the reconfiguration criteria are not met, then control proceeds back to tracking a write amplification metric. As noted previously a frequency with which operation 702 happens can be independent of the frequency with which operations 704 and 706 occur.

Figure 8:
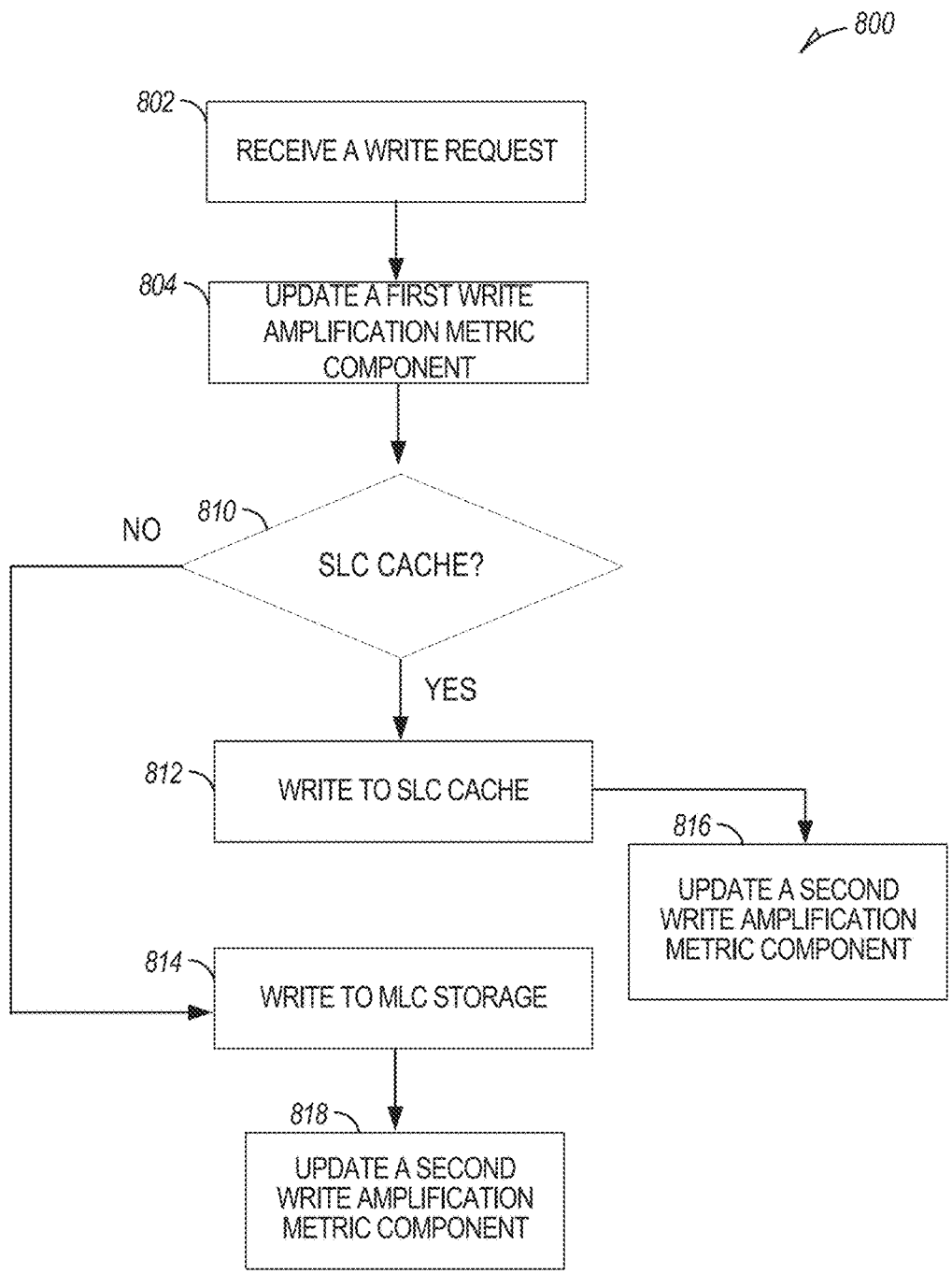
FIG. 8 illustrate a method of handling a write request using either SLC cache or MLC storage and updating write amplification metrics according to some examples of the present disclosure.

Turning now to FIG. 8, a flowchart of a method 800 of implementing an SLC cache along with tracking a write amplification metric is shown according to some examples of the present disclosure. It will be appreciated by one of ordinary skill having the benefit of the present disclosure that other types of operations on the memory device such as garbage collection can trigger additional instances of write amplification where the write amplification metric can be updated in addition to those shown in FIG. 8.

At operation 802 a write request can be received from a host device. For example, a request from an operating system to write data to the memory device. At operation 804 a write amplification metric component can be updated. As previously described, in some examples, a write amplification metric can be calculated from one or more write amplification metric components. For example, at operation 804, the write amplification metric component that is updated can be a count of a number of bytes that are sent for writing by the host. Other components can include the number of bytes actually written to flash memory (e.g., updated at 816 and 818). At operation 810 the memory controller determines if the write request can be satisfied by writing the data sent from the host into SLC cache. For example, the memory controller can determine if there is enough space in the SLC cache. Other example checks at operation 810 can include whether the host has a preference as to whether SLC cache is used or not. If the SLC cache is to be used, then at operation 812 the data is written to the SLC cache. At operation 816 a second write amplification metric component can be updated—for example, adding a number of bytes written to flash as a result of operation 812.

If the data is not to be written to SLC cache, then at operation 814, the data is written to MLC storage and then at operation 818 the second write amplification metric component can be updated—for example, adding a number of bytes written to flash as a result of operation 814. In some examples, the second write amplification metric component can be increased more at operation 816 than at operation 818 to reflect that the data written to SLC cache at operation 812 will be eventually moved to MLC storage (and thus incurring another flash write). In other examples, the second write amplification metric component 816 can be increased the same whether it is increased at operation 816 or 818 and the second write amplification metric component can be updated to reflect the move from SLC cache to MLC storage at the time the data is moved from SLC cache to MLC storage.

In some examples, write amplification can be calculated by dividing the second write amplification metric component by the first write amplification metric component to get a proportion of data actually written to the flash to the data requested to be written to the flash.

Figure 9:
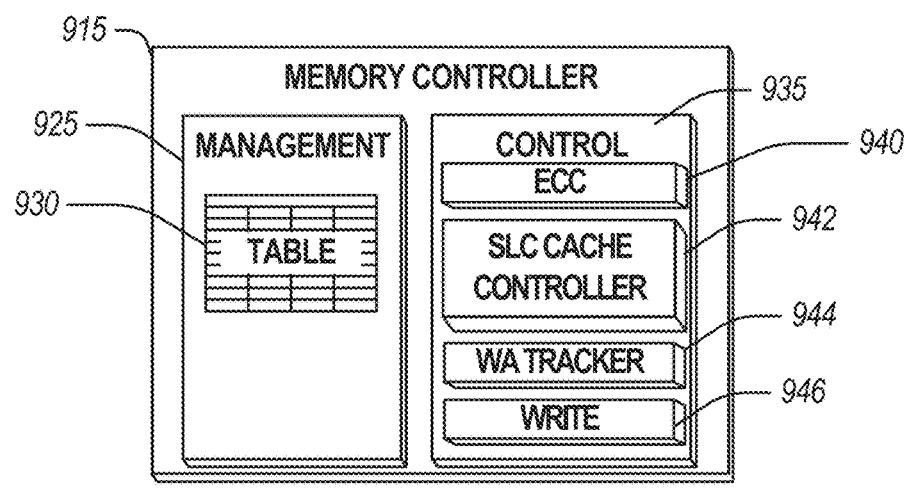
FIG. 9 illustrates a schematic of a memory controller according to some examples of the present disclosure.

FIG. 9 shows an example logical diagram of a functionality of a memory controller 915 according to some examples of the present disclosure. For example, memory controller 915 can be an example implementation of memory controller 115. The memory controller 915 can include a memory manager 925 and an array controller 935. Memory manger 925 can be an example of memory manager 125 and array controller 935 can be an example of array controller 135.

The memory manager 925 can include a set of management tables 930 configured to maintain various information associated with one or more component of the memory device. Management tables 930 can be an example of management table 130. As noted with respect to management table 130, the management tables 930 can include information regarding block age, block erase count, error history, or one or more error counts (e.g., a write operation error count, a read bit error count, a read operation error count, an erase error count, etc.) for one or more blocks of memory cells coupled to the memory controller 915. Management tables 930 can store of one or more components of a write amplification metric.

The array controller 935 can include, among other things, circuitry or components configured to control memory operations associated with writing data to, reading data from, or erasing one or more memory cells of the memory device coupled to the memory controller 915. Array controller 935 can be an example of array controller 135. The memory operations can be based on, for example, host commands received from the host 105, or internally generated by the memory manager 125 (e.g., in association with wear leveling, error detection or correction, etc.). The array controller 935 can include an error correction code (ECC) component 940, which can be an example of error correction code (ECC) component 140.

SLC cache controller 942 can set an SLC cache size based upon one or more metrics of the memory device. Example metrics include one or more of device utilization, free memory available, memory used, write amplification, or the like. For example, the SLC cache controller 942 can calculate an SLC cache size based upon a write amplification metric. In another example, the SLC cache controller 942 can calculate an SLC cache size based upon a write amplification metric and a logical saturation component. SLC cache controller can reconfigure one or more memory cells (between SLC and MLC) to implement the SLC cache reconfiguration. SLC cache controller can determine when to reconfigure the SLC cache—for example, by monitoring the WA and logical saturation metrics and comparing those metrics to one or more predetermined conditions. In some examples, SLC cache controller 942 can implement the operations of FIGS. 6 and 7.

Write amplification (WA) tracker component 944 can track write amplification metric components and calculate a write amplification metric. For example, based upon requests to write data received from the host and actual data written to the physical structures of the memory device. The components of the write amplification metric can be stored in table 930 and used by WA tracker component to calculate a write amplification metric.

Write component 946 can handle write requests by hosts. For example, write component 946 can implement the method of FIG. 8 by writing the request to either SLC cache or MLC depending on whether SLC cache is available, in some examples, WA tracker 944 can increment the write amplification metric component metrics or write component 946 can increment the write amplification metric component metrics (e.g., operations 816 and 818 of FIG. 8).

Figure 10:
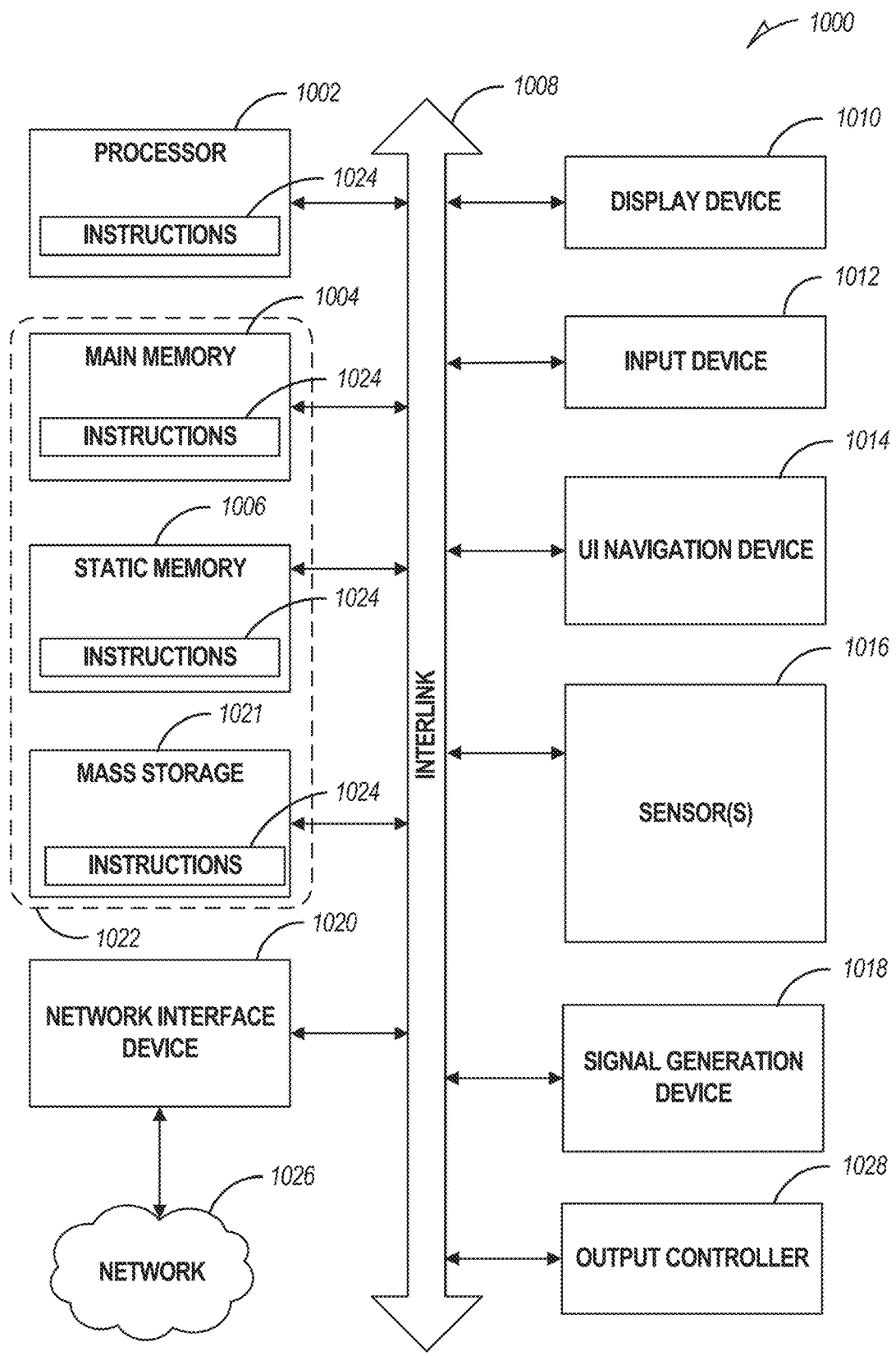
FIG. 10 is a block diagram illustrating an example of a machine upon which one or more embodiments can be implemented.

FIG. 10 illustrates a block diagram of an example machine 1000 upon which any one or more of the techniques (e.g., methodologies) discussed herein can perform. In alternative embodiments, the machine 1000 can operate as a standalone device or can be connected (e.g., networked) to other machines. In a networked deployment, the machine 1000 can operate in the capacity of a server machine, a client machine, or both in server-client network environments. In an example, the machine 1000 can act as a peer machine in peer-to-peer (P2P) (or other distributed) network environment. The machine 1000 can be a personal computer (PC), a tablet PC, a set-top box (STB), a personal digital assistant (PDA), a mobile telephone, a web appliance, an IoT device, automotive system, a host device, or any machine capable of executing instructions (sequential or otherwise) that specify actions to be taken by that machine. Components of machine 1000 can be present in a memory device (e.g., a processor, main memory, mass storage and the like). Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 1000 (e.g., the host device 105, the memory device 110, etc.) can include a hardware processor 1002 (e.g., a central processing unit (CPU), a graphics processing unit (GPU), a hardware processor core, or any combination thereof, such as the memory controller 115, etc.), a main memory 1004 and a static memory 1006, some or all of which can communicate with each other via an interlink (e.g., bus) 1008. The machine 1000 can further include a display unit 10:10, an alphanumeric input device 1012 (e.g., a keyboard), and a user interface (UI) navigation device 1014 (e.g., a mouse). In an example, the display unit 1010, input device 1012 and UI navigation device 1014 can be a touch screen display. The machine 1000 can additionally include a storage device (e.g., drive unit) 1016, a signal generation device 1018 (e.g., a speaker), a network interface device 1020, and one or more sensors 1016, such as a global positioning system (SPS) sensor, compass, accelerometer, or other sensor. The machine 1000 can include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1016 can include a machine readable medium 1022 on which is stored one or more sets of data structures or instructions 1024 (e.g., software) embodying or utilized by any one or more of the techniques or functions described herein. The instructions 1024 can also reside, completely or at least partially, within the main memory 1004, within static memory 1006, or within the hardware processor 1002 during execution thereof by the machine 1000. In an example, one or any combination of the hardware processor 1002, the main memory 1004, the static memory 1006, or the storage device 1016 can constitute the machine readable medium 1022.

While the machine readable medium 1022 is illustrated as a single medium, the term "machine readable medium" can include a single medium or multiple media (e.g., a centralized or distributed database, or associated caches and servers) configured to store the one or more instructions 1024.

The term "machine readable medium" can include any medium capable of storing, encoding, or carrying instructions for execution by the machine 1000 and that cause the machine 1000 to perform any one or more of the techniques of the present disclosure, or capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1024 (e.g., software, programs, an operating system (OS), etc.) or other data are stored on the storage device 1021, can be accessed by the memory 1004 for use by the processor 1002. The memory 1004 (e.g., DRAM) is typically fast, but volatile, and thus a different type of storage than the storage device 1021 (e.g., an SSD), which is suitable for long-term storage, including while in an "off" condition. The instructions 1024 or data in use by a user or the machine 1000 are typically loaded in the memory 1004 for use by the processor 1002. When the memory 1004 is full, virtual space from the storage device 1021 can be allocated to supplement the memory 1004; however, because the storage 1021 device is typically slower than the memory 1004, and write speeds are typically at least twice as slow as read speeds, use of virtual memory can greatly reduce user experience due to storage device latency (in contrast to the memory 1004, e.g., DRAM). Further, use of the storage device 1021 for virtual memory can greatly reduce the usable lifespan of the storage device 1021.

In contrast to virtual memory, virtual memory compression (e.g., the Linux® kernel feature "ZRAM") uses part of the memory as compressed block storage to avoid paging to the storage device 1021. Paging takes place in the compressed block until it is necessary to write such data to the storage device 1021. Virtual memory compression increases the usable size of memory 1004, while reducing wear on the storage device 1021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. hi response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1024 can further be transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as WiFi®, IEEE 802.16 family of standards known as WiMax®), IEEE 802.15.4 family of standards, peer-to-peer (P2P) networks, among others. In an example, the network interface device 1020 can include one or more physical jacks (e.g., Ethernet, coaxial, or phone jacks) or one or more antennas to connect to the communications network 1026. In an example, the network interface device 1020 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1000, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure can be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but can instead be generally perpendicular to the surface of the substrate, and can form an acute angle with the surface of the substrate (e.g., between 60 and 120 degrees, etc.).

In some embodiments described herein, different doping configurations can be applied to a source-side select gate (SGS), a control gate (CG), and a drain-side select gate (SGD), each of which, in this example, can be formed of or at least include polysilicon, with the result such that these tiers (e.g., polysilicon, etc.) can have different etch rates when exposed to an etching solution. For example, in a process of forming a monolithic pillar in a 3D semiconductor device, the SGS and the CG can form recesses, while the SSD can remain less recessed or even not recessed. These doping configurations can thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a method, comprising: at a memory controller of a memory device: during operation of the memory device, tracking a write amplification metric that measures a difference between an amount of data physically written to memory cells of the memory device and an amount of data requested to be written to the memory device by a host; and reallocating a portion of a pool of memory cells of the memory device between single level cell (SLC) cache and mufti level cell (MLC) storage based at least in part on a value of the write amplification metric, the reallocating including writing at least one electrical state to a register.

In Example 2, the subject matter of Example 1 includes, wherein memory cells allocated as MLC storage store three or more bits of data per memory cell.

In Example 3, the subject matter of Examples 1-2 includes, receiving a write request to write host data to the memory device; and writing the host data to SLC cache based upon a determination that enough memory cells in the SLC cache are free to store the host data.

In Example 4, the subject matter of Examples 1-3 includes, wherein reallocating the portion of the pool of memory cells of the memory device between SLC cache and MLC storage comprises determining an SLC cache size based upon the write amplification metric and a logical saturation of the memory device.

In Example 5, the subject matter of Examples 1-4 includes, wherein reallocating the portion of the pool of memory cells of the memory device between SLC cache and MLC storage comprises determining an SLC cache size based upon the write amplification metric, a device longevity requirement, and a logical saturation of the memory device.

In Example 6, the subject matter of Examples 1-5 includes, wherein reallocating the portion of the pool of memory cells of the memory device between SLC cache and MLC storage comprises determining an SLC cache size using the write amplification metric and the logical saturation of the memory device as inputs to a table stored in a memory of the memory device.

In Example 7, the subject matter of Examples 1-6 includes, wherein the tracking and reallocating are responsive to receiving a write request from a host.

In Example 8, the subject matter of Examples 1-7 includes, wherein the reallocating is responsive to the write amplification metric satisfying a reallocation condition.

Example 9 is a memory device comprising: a memory controller configured to perform operations during operation of the memory device comprising: tracking a write amplification metric that measures a difference between an amount of data physically written to memory cells of the memory device and an amount of data requested to be written to the memory device by a host; and reallocating a portion of a pool of memory cells of the memory device between single level cell (SLC) cache and multi level cell (MLC) storage based at least in part on a value of the write amplification metric, the reallocating including writing at least one electrical state to a register.

In Example 10, the subject matter of Example 9 includes, wherein memory cells allocated as MLC storage store three or more bits of data per memory cell.

In Example 11, the subject matter of Examples 9-10 includes, wherein the memory controller is further configured to perform operations comprising: receiving a write request to write host data to the memory device; and writing the host data to SLC cache based upon a determination that enough memory cells in the SLC cache are free to store the host data.

In Example 12, the subject matter of Examples 9-11 includes, wherein the operations of reallocating the portion of the pool of memory cells of the memory device between SLC cache and MLC storage comprises determining an SLC cache size based upon the write amplification metric and a logical saturation of the memory device.

In Example 13, the subject matter of Examples 9-12 includes, wherein the operations of reallocating the portion of the pool of memory cells of the memory device between SLC cache and MLC storage comprises determining an SLC cache size based upon the write amplification metric, a device longevity requirement, and a logical saturation of the memory device.

In Example 14, the subject matter of Examples 9-13 includes, wherein the operations of reallocating the portion of the pool of memory cells of the memory device between SLC cache and MLC storage comprises determining an SLC cache size using the write amplification metric and the logical saturation of the memory device as inputs to a table stored in a memory of the memory device.

In Example 15, the subject matter of Examples 9-14 includes, wherein the operations of tracking and reallocating are responsive to receiving a write request from a host.

In Example 16, the subject matter of Examples 9-15 includes, wherein the operations of reallocating is responsive to the write amplification metric satisfying a reallocation condition.

Example 17 is a machine-readable medium, storing instructions, when performed by a controller of a memory device, cause the controller to perform operations during operation of the memory device comprising: tracking a write amplification metric that measures a difference between an amount of data physically written to memory cells of the memory device and an amount of data requested to be written to the memory device by a host; and reallocating a portion of a pool of memory cells of the memory device between single level cell (SLC) cache and multi level cell (MLC) storage based at least in part on a value of the write amplification metric, the reallocating including writing at least one electrical state to a register.

In Example 18, the subject matter of Example 17 includes, wherein memory cells allocated as MLC storage store three or more bits of data per memory cell.

In Example 19, the subject matter of Examples 17-18 includes, wherein the memory controller is further configured to perform operations comprising: receiving a write request to write host data to the memory device; and writing the host data to SLC cache based upon a determination that enough memory cells in the SLC cache are free to store the host data.

In Example 20, the subject matter of Examples 17-19 includes, wherein the operations of reallocating the portion of the pool of memory cells of the memory device between SLC cache and MLC storage comprises determining an SLC cache size based upon the write amplification metric and a logical saturation of the memory device.

In Example 21, the subject matter of Examples 17-20 includes, wherein the operations of reallocating the portion of the pool of memory cells of the memory device between SLC cache and MLC storage comprises determining an SLC cache size based upon the write amplification metric, a device longevity requirement, and a logical saturation of the memory device.

In Example 22, the subject matter of Examples 17-21 includes, wherein the operations of reallocating the portion of the pool of memory cells of the memory device between SLC cache and MLC storage comprises determining an SLC cache size using the write amplification metric and the logical saturation of the memory device as inputs to a table stored in a memory of the memory device.

In Example 23, the subject matter of Examples 17-22 includes, wherein the operations of tracking and reallocating are responsive to receiving a write request from a host.

In Example 24, the subject matter of Examples 17-23 includes, wherein the operations of reallocating is responsive to the write amplification metric satisfying a reallocation condition.

Example 25 is a memory device, comprising: at a memory controller of a memory device: during operation of the memory device, means for tracking a write amplification metric that measures a difference between an amount of data physically written to memory cells of the memory device and an amount of data requested to be written to the memory device by a host; and means for reallocating a portion of a pool of memory cells of the memory device between single level cell (SLC) cache and multi level cell (MLC) storage based at least in part on a value of the write amplification metric, the reallocating including writing at least one electrical state to a register.

In Example 26, the subject matter of Example 25 includes, wherein memory cells allocated as MLC storage store three or more bits of data per memory cell.

In Example 27, the subject matter of Examples 25-26 includes, means for receiving a write request to write host data to the memory device; and means for writing the host data to SLC cache based upon a determination that enough memory cells in the SLC cache are free to store the host data.

In Example 28, the subject matter of Examples 25-27 includes, wherein the means for reallocating the portion of the pool of memory cells of the memory device between SLC cache and MLC storage comprises means for determining an SLC cache size based upon the write amplification metric and a logical saturation of the memory device.

In Example 29, the subject matter of Examples 25-28 includes, wherein the means for reallocating the portion of the pool of memory cells of the memory device between SLC cache and MLC storage comprises means for determining an SLC cache size based upon the write amplification metric, a device longevity requirement, and a logical saturation of the memory device.

In Example 30, the subject matter of Examples 25-29 includes, wherein the means for reallocating the portion of the pool of memory cells of the memory device between SLC cache and MLC storage comprises means for determining an SLC cache size using the write amplification metric and the logical saturation of the memory device as inputs to a table stored in a memory of the memory device.

In Example 31, the subject matter of Examples 25-30 includes, wherein the tracking and reallocating are responsive to receiving a write request from a host.

In Example 32, the subject matter of Examples 25-31 includes, wherein the reallocating is responsive to the write amplification metric satisfying a reallocation condition.

Example 33 is at least one machine-readable medium including instructions that, when executed by processing circuitry, cause the processing circuitry to perform operations to implement of any of Examples 1-32.

Example 34 is an apparatus comprising means to implement of any of Examples 1-32.

Example 35 is a system to implement of any of Examples 1-32

Example 36 is a method to implement of any of Examples 1-32.

The invention claimed is:

1. A method, comprising:
   during operation of a memory device, tracking a write amplification metric that measures a difference between an amount of data physically written to memory cells of the memory device and an amount of data requested to be written to the memory device by a host; and
   reallocating a portion of a pool of memory cells of the memory device between single level cell (SLC) cache and multi level cell (MLC) storage based upon a calculation of a SLC cache size using a formula including a value of the write amplification metric and a logical saturation level of the memory device, the reallocating including writing at least one electrical state to a register.

2. The method of claim 1, wherein memory cells allocated as MLC storage store three or more bits of data per memory cell.

3. The method of claim 1, comprising:
   receiving a write request to write host data to the memory device; and
   writing the host data to SLC cache based upon a determination that enough memory cells in the SLC cache are free to store the host data.

4. The method of claim 1, wherein reallocating the portion of the pool of memory cells of the memory device between SLC cache and MLC storage comprises determining an SLC cache size based upon the write amplification metric, a device longevity requirement, and the logical saturation level of the memory device.

5. The method of claim 1, wherein reallocating the portion of the pool of memory cells of the memory device between SLC cache and MLC storage comprises determining an SLC cache size using the write amplification metric and the logical saturation level of the memory device as inputs to a table stored in a memory of the memory device.

6. The method of claim 1, wherein the tracking and reallocating are responsive to receiving a write request from a host.

7. The method of claim 1, wherein the reallocating is responsive to the write amplification metric satisfying a reallocation condition.

8. A memory device comprising:
a memory controller configured to perform operations during operation of the memory device comprising:
tracking a write amplification metric that measures a difference between an amount of data physically written to memory cells of the memory device and an amount of data requested to be written to the memory device by a host; and
reallocating a portion of a pool of memory cells of the memory device between single level cell (SLC) cache and multi level cell (MLC) storage based upon a calculation of a SLC cache size using a formula including a value of the write amplification metric and a logical saturation level of the memory device, the reallocating including writing at least one electrical state to a register.

9. The memory device of claim 8, wherein memory cells allocated as MLC storage store three or more bits of data per memory cell.

10. The memory device of claim 8, wherein the memory controller is further configured to perform operations comprising:
receiving a write request to write host data to the memory device; and
writing the host data to SLC cache based upon a determination that enough memory cells in the SLC cache are free to store the host data.

11. The memory device of claim 8, wherein the operations of reallocating the portion of the pool of memory cells of the memory device between SLC cache and MLC storage comprises determining an SLC cache size based upon the write amplification metric, a device longevity requirement, and the logical saturation level of the memory device.

12. The memory device of claim 8, wherein the operations of reallocating the portion of the pool of memory cells of the memory device between SLC cache and MLC storage comprises determining an SLC cache size using the write amplification metric and the logical saturation level of the memory device as inputs to a table stored in a memory of the memory device.

13. The memory device of claim 8, wherein the operations of tracking and reallocating are responsive to receiving a write request from a host.

14. The memory device of claim 8, wherein the operations of reallocating is responsive to the write amplification metric satisfying a reallocation condition.

15. A non-transitory machine-readable medium, storing instructions, when performed by a controller of a memory device, cause the controller to perform operations during operation of the memory device comprising:
tracking a write amplification metric that measures a difference between an amount of data physically written to memory cells of the memory device and an amount of data requested to be written to the memory device by a host; and
reallocating a portion of a pool of memory cells of the memory device between single level cell (SLC) cache and multi level cell (MLC) storage based upon a calculation of a SLC cache size using a formula including a value of the write amplification metric and a logical saturation level of the memory device, the reallocating including writing at least one electrical state to a register.

16. The non-transitory machine-readable medium of claim 15, wherein memory cells allocated as MLC storage store three or more bits of data per memory cell.

17. The non-transitory machine-readable medium of claim 15, wherein the controller of the memory device is further configured to perform operations comprising:
receiving a write request to write host data to the memory device; and
writing the host data to SLC cache based upon a determination that enough memory cells in the SLC cache are free to store the host data.

18. The method of claim 1, wherein the logical saturation level comprises a percentage of valid user data written in the memory device of the total user-available data space.

19. The memory device of claim 8, wherein the logical saturation level comprises a percentage of valid user data written in the memory device of the total user-available data space.

20. The non-transitory machine-readable medium of claim 15, wherein the logical saturation level comprises a percentage of valid user data written in the memory device of the total user-available data space.

* * * * *